United States Patent [19]
Katsui

[11] Patent Number: 5,689,404
[45] Date of Patent: Nov. 18, 1997

[54] HEAT SINK HAVING AIR MOVEMENT DEVICE POSITIONED AMONG TINS AND BETWEEN HEATING ELEMENTS

[75] Inventor: Tadashi Katsui, Kawasaki, Japan

[73] Assignee: Fujitsu, Ltd., Kawasaki, Japan

[21] Appl. No.: 548,475

[22] Filed: Oct. 26, 1995

[30] Foreign Application Priority Data

Mar. 17, 1995 [JP] Japan ................................ 7-059545

[51] Int. Cl.⁶ ............................................. H05K 7/20
[52] U.S. Cl. .................. 361/697; 165/80.3; 415/178; 415/213.1
[58] Field of Search .................. 174/16.1, 16.3; 361/687, 694, 695, 697, 690; 454/184; 165/121–126, 80.3; 310/68 C, 68 D; 257/722; 416/223 R; 415/115, 177, 178, 208.3, 213.1, 214.1

[56] References Cited

U.S. PATENT DOCUMENTS

| | | |
|---|---|---|
| 4,513,812 | 4/1985 | Papst et al. |
| 5,022,462 | 6/1991 | Flint ........................................ 165/80.4 |
| 5,280,409 | 1/1994 | Selna ........................................ 361/720 |
| 5,299,632 | 4/1994 | Lee . |
| 5,335,722 | 8/1994 | Wu . |
| 5,377,745 | 1/1995 | Hsieh ....................................... 165/80.3 |
| 5,409,352 | 4/1995 | Lin ........................................... 415/177 |
| 5,484,013 | 1/1996 | Morikawa ................................ 165/80.3 |
| 5,486,980 | 1/1996 | Jordan ..................................... 361/697 |
| 5,504,650 | 4/1996 | Katsui ...................................... 361/697 |
| 5,522,700 | 6/1996 | Hong ....................................... 415/177 |

FOREIGN PATENT DOCUMENTS

| | | |
|---|---|---|
| 0614330 | 9/1994 | European Pat. Off. . |
| 0620592 | 10/1994 | European Pat. Off. . |
| 4410029 | 1/1995 | Germany . |
| WO 8900751 | 1/1989 | WIPO . |

*Primary Examiner*—Gerald P. Tolin
*Attorney, Agent, or Firm*—Staas & Halsey

[57] ABSTRACT

The heat sink of the present invention applicable to at least two heating elements including two integrated circuit packages includes a base member fixed to the integrated circuit packages and having a plurality of fins, and air cooling means provided at a substantially central position of the base member. This construction allows an improvement in reliability, a reduction in noise, and a reduction in power consumption.

17 Claims, 9 Drawing Sheets

5,689,404

HEAT SINK HAVING AIR MOVEMENT DEVICE POSITIONED AMONG FINS AND BETWEEN HEATING ELEMENTS

BACKGROUND OF THE INVENTION

1. Field of the Invention

The present invention relates generally to a heat sink having forced air cooling means, and more particularly to a heat sink applied to at least two heating elements including first and second integrated circuit packages mounted on a printed wiring board.

2. Description of the Related Art

In recent years, a portable electronic device represented by a laptop personal computer, for example, has widely spread on the market as an electronic device required to have a reduced size and a high reliability. To achieve a high performance of this kind of electronic device, one or more higher-wattage integrated circuit packages are necessary to use. To ensure heat radiation of the higher-wattage integrated circuit packages, a heat sink is used in mounting the integrated circuit packages on a printed wiring board.

Conventionally, a heat sink with a built-in fan has been put in practical use as a heat sink having forced air cooling means. In applying such a heat sink with a built-in fan to an electronic device having a plurality of heating elements, the heat sink with the built-in fan is fixed to each heating element. Thus, a plurality of heat sinks with built-in fans are used, causing a reduction in reliability, an increase in noise, an increase in power consumption, and an increase in cost. Further, when each heating element is small in size, a radiation area of each heat sink is insufficient, causing a difficulty of adaptation to a higher-wattage heating element.

SUMMARY OF THE INVENTION

It is therefore an object of the present invention to provide a heat sink which is suitably used with a plurality of heating elements.

According to the present invention, there is provided a heat sink applied to at least two heating elements including first and second integrated circuit packages mounted on a printed wiring board, comprising a base member having a lower surface and an upper surface, the lower surface being fixed to the first and second integrated circuit packages, the upper surface having a blowing region defined between the first and second integrated circuit packages and a plurality of upward projecting radiation fins formed at a portion except the blowing region; and air cooling means provided in the blowing region for circulating air through the radiation fins.

In the present invention, the blowing region in which the air cooling means is located is defined at a substantially intermediate position between the first and second integrated circuit packages for the purposes of forcibly cooling both the first and second integrated circuit packages by the use of the single air cooling means and preventing an increase in temperature of bearings of a fan assembly as an example of the air cooling means to thereby improve the reliability.

In the present invention, the single air cooling means is used to the plurality of heating elements, thereby allowing a reduction in noise and a reduction in power consumption. Further, in the case where the first and second integrated circuit packages are spaced from each other, the radiation area of the heat sink can be increased to thereby improve the cooling performance.

The above and other objects, features and advantages of the present invention and the manner of realizing them will become more apparent, and the invention itself will best be understood from a study of the following description and appended claims with reference to the attached drawings showing some preferred embodiments of the invention.

DESCRIPTION OF THE PREFERRED EMBODIMENTS

Some preferred embodiments of the present invention will now be described in detail with reference to the attached drawings.

Figure 1:
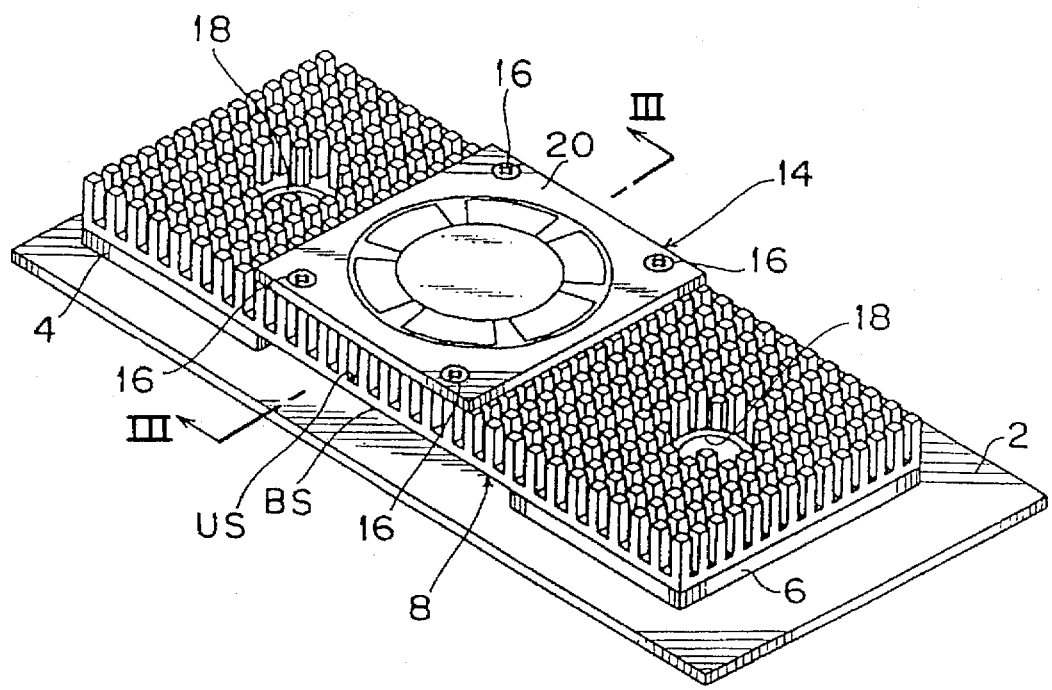
FIG. 1 is a perspective view of a heat sink showing a first preferred embodiment of the present invention.
Figure 2:
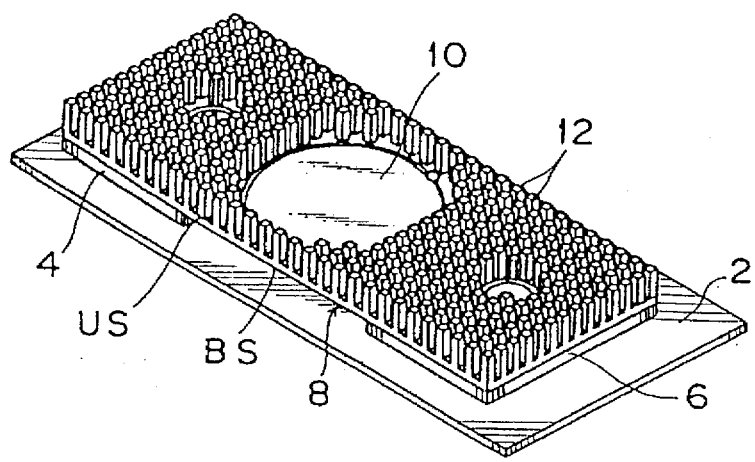
FIG. 2 is a perspective view of the heat sink in the condition where a cover shown in FIG. 1 is removed.
Figure 3:
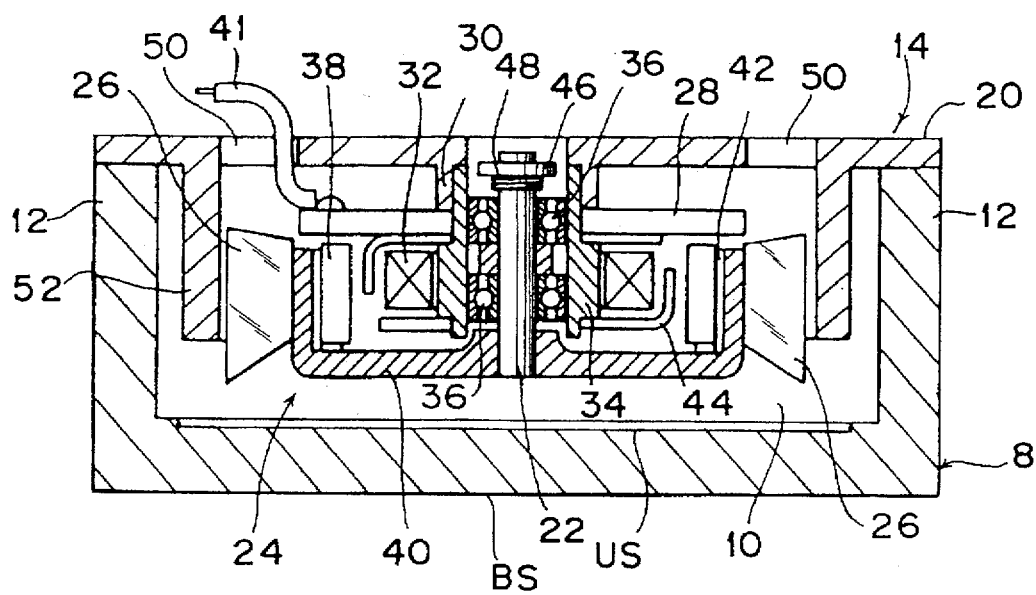
FIG. 3 is a cross section taken along the line III—III in FIG. 1.

FIG. 1 is a perspective view of a heat sink showing a first preferred embodiment of the present invention; FIG. 2 is a perspective view of the heat sink, showing a condition where a cover shown in FIG. 1 is removed; and FIG. 3 is a cross section taken along the line III—III in FIG. 1. The heat sink is applied to at least two heating elements including integrated circuit packages 4 and 6 mounted on a printed wiring board 2. Although the heating elements are the integrated circuit packages 4 and 6 only in the following description, the heat sink of the present invention is applicable to any other heating elements if they are mounted on the printed wiring board 2. A base member 8 has a lower surface BS fixed to the upper surfaces of the integrated circuit packages 4 and 6 so as to make close contact therewith. The base member 8 is fixed by bonding to the integrated circuit packages 4 and 6 or it may be fixed by using belts or clippers formed of resin.

As best shown in FIG. 2, a blowing region 10 is defined on an upper surface US of the base member 8 at its substantially intermediate portion between the integrated circuit packages 4 and 6. The base member 8 has a plurality of radiation fins 12 projecting from the upper surface US except the blowing region 10. A fan assembly 14 is mounted on the fins 12, so as to make air circulation between the blowing region 10 and the outside of the heat sink through the fins 12. In this preferred embodiment, the fan assembly 14 is fixed to the fins 12 by means of four screws 16.

As shown in FIG. 3, the locational relationship between the fan assembly 14 and the base member 8 is such that a given clearance is defined between the bottom of the fan assembly 14 and the upper surface US of the base member 8. In this manner, the fan assembly 14 is not in direct contact with the upper surface US of the base member 8. In other words, the fan assembly 14 is located in a floating condition over the upper surface US of the base member 8. Reference numerals 18 in FIG. 1 denote through holes formed so as to extend from the upper surface to the lower surface of the base member 8. Each of the integrated circuit packages 4 and 6 has an anchor bolt (not shown) projecting from the upper surface of each integrated circuit package at the central position thereof, and the anchor bolt is passed through each through hole 18, thereby ensuring the close contact of the base member 8 and the integrated circuit packages 4 and 6. If the integrated circuit packages 4 and 6 have no anchor bolts, the through holes 18 of the base member 8 are not necessary.

FIG. 3 is a cross section taken along the line III—III in FIG. 1, showing a detailed configuration of the fan assembly 14 as the air cooling means. The fan assembly 14 is composed of a cover 20 fixed to the fins 12 so as to cover the blowing region 10, a motor 24 fixed to the cover 20 and having a spindle 22 extending in the direction of thickness of the base member 8, a plurality of blades 26 adapted to be rotated by the motor 24, and a printed wiring board 28 having a driving circuit for driving the motor 24. The cover 20 has an annular projection 30 projecting from a lower surface of the cover 20, and the motor 24 is fixed to the projection 30. The motor 24 further has a stator 34 fixed by press fit to the annular projection 30 and having a coil 32 on an outer circumferential surface of the stator 34, bearings 36 for rotatably supporting the spindle 22 to the stator 34, and a rotor 40 fixed to the spindle 22 and having an inner circumferential wall on which a magnet 38 is fixed and an outer circumferential wall on which the blades 26 are fixed. Reference numeral 41 denotes a lead wire for connecting the driving circuit to an external device; reference numeral 42 denotes a ring yoke; reference numeral 44 denotes a yoke; reference numeral 46 denotes a cut washer mounted on the spindle 22; and reference numeral 48 denotes a spring for upward biasing the spindle 22. Further, reference numerals 50 denote a plurality of air circulation openings formed through the cover 20, and reference numeral 52 denotes an annular projection for ensuring a static pressure difference. The air circulation openings 50 are formed along the locus of rotation of the blades 26.

In this preferred embodiment, the outside air is taken through the openings 50 into the blowing region 10, and the air thus taken into the blowing region 10 is blown against the fins 12, thereby effecting forced air cooling. The driving direction of the motor 24 or the inclination angle of each blade 26 may be changed so as to reverse the direction of flow of the air. According to this preferred embodiment, the forced air cooling can be effected to at least two heating elements by means of the single fan assembly, thereby allowing an improvement in reliability, a reduction in noise, and a reduction in power consumption. Furthermore, since the integrated circuit packages 4 and 6 are spaced from each other, the radiation area of the base member 8 can be increased to thereby improve the cooling performance of the heat sink. In this preferred embodiment, the fan assembly 14 is not located just over the integrated circuit package 4 or 6. Accordingly, the temperature of the motor 24 does not so rise, thereby ensuring a high reliability.

Figure 4:
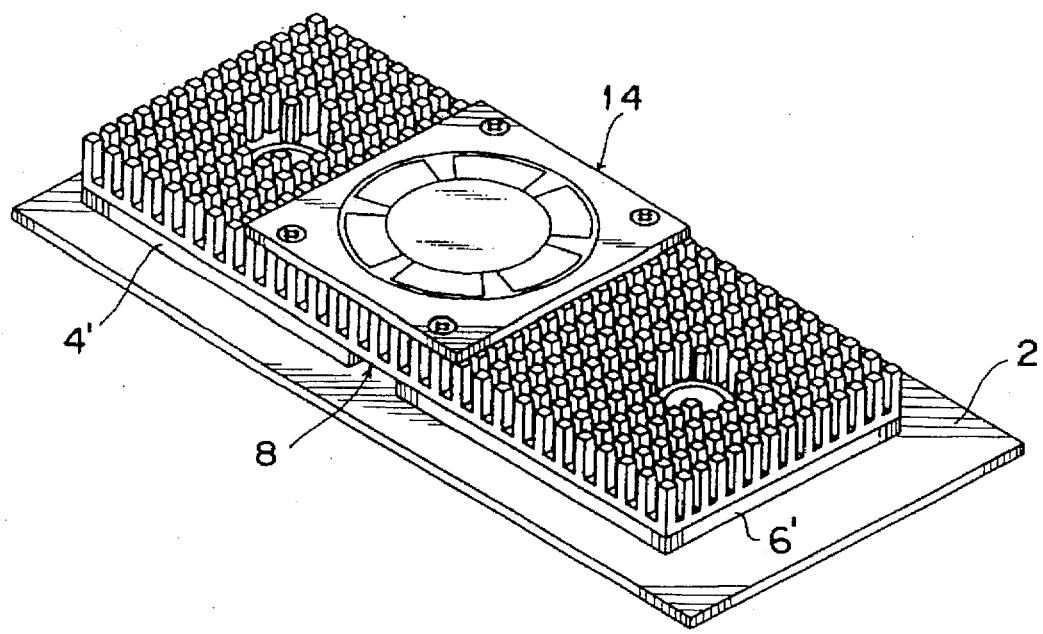
FIG. 4 is a perspective view of a heat sink showing a second preferred embodiment of the present invention.

FIG. 4 is a perspective view of a heat sink showing a second preferred embodiment of the present invention. In this preferred embodiment, the heat sink shown in FIG. 1 is applied to relatively large integrated circuit packages 4' and 6' The relatively large sizes of the integrated circuit packages 4' and 6' possibly cause a configuration such that the space between the integrated circuit packages 4' and 6' is smaller than the width of the fan assembly 14 as shown. Also in such a case, the fan assembly 14 is located at a substantially intermediate position between the integrated circuit packages 4' and 6', thereby obtaining good cooling characteristics. Preferably, a central portion of the fan assembly 14 is positioned at or near the midpoint on the straight line connecting the center of heat generation from the integrated circuit package 4' and the center of heat generation from the integrated circuit package 6'. The base member 8 in the first and second preferred embodiments may be formed of aluminum, for example, which is good in heat radiation property and workability.

Figure 5:
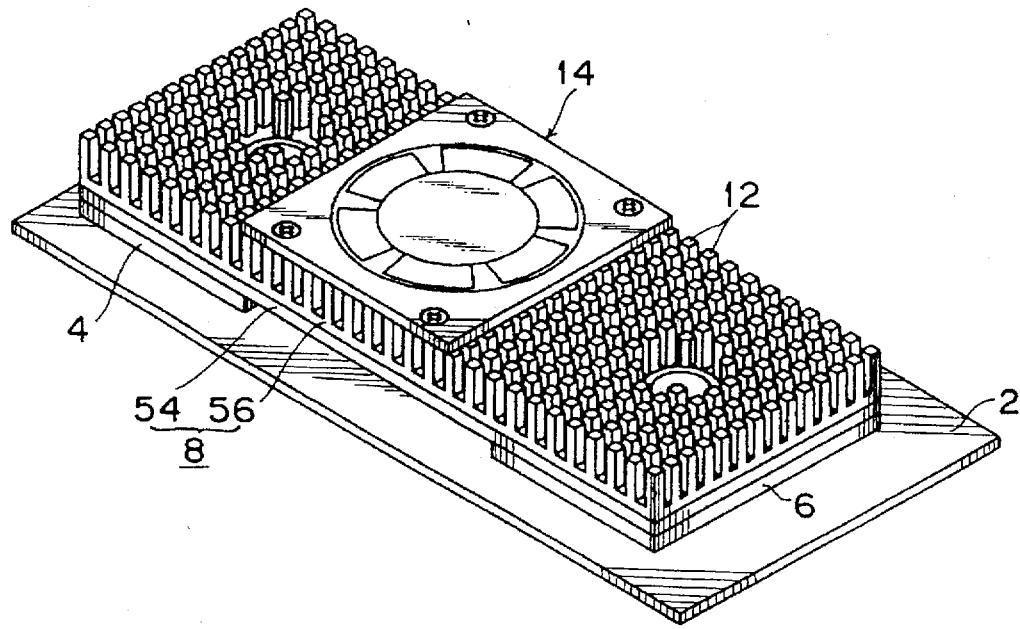
FIG. 5 is a perspective view of a heat sink showing a third preferred embodiment of the present invention.

FIG. 5 is a perspective view of a heat sink showing a third preferred embodiment of the present invention. This heat sink is characterized in that the base member 8 has a two-layer structure comprising of a first member 54 making close contact with the integrated circuit packages 4 and 6 and a second member 56 integrally formed with the fins 12. Preferably, the materials of the first and second members 54 and 56 are selected so that the thermal conductivity of the first member 54 is larger than that of the second member 56. Accordingly, heat generated from the integrated circuit packages 4 and 6 can be easily transmitted to each fin 12, thereby accelerating the uniformity of heat transfer in the base member 8 to extremely improve the cooling performance. For example, the first member 54 may be formed of copper or copper tungsten, and the second member 56 may be formed of aluminum. In the case that the first member 54 is formed of copper tungsten, the coefficient of linear thermal expansion of copper tungsten is substantially equal to that of ceramics which is a typical material of the integrated circuit packages 4 and 6, and therefore the close contact of the base member 8 and the integrated circuit packages 4 and 6 can be maintained for a long period of time.

Figure 6:
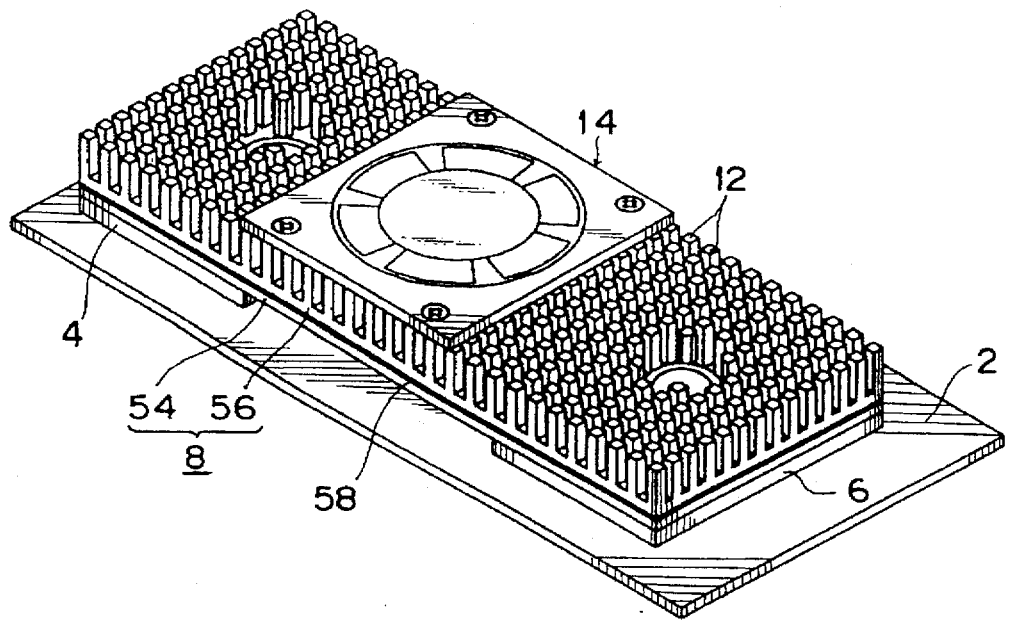
FIG. 6 is a perspective view of a heat sink showing a fourth preferred embodiment of the present invention.

FIG. 6 is a perspective view of a heat sink showing a fourth preferred embodiment of the present invention. This preferred embodiment is characterized by a bonding technique between the first member 54 formed of copper or copper tungsten and the second member 56 formed of aluminum. A nickel plating layer (not shown) is formed on at least the lower surface of the second member 56. A solder layer 58 is interposed between the first member 54 and the second member 56, thereby brazing the first and second members 54 and 56 together through the solder layer 58. The brazing of the first and second members 54 and 56 together allows a reduction in heat transfer loss through the bonding surface of the first and second members 54 and 56, thereby improving the cooling performance. If the brazing causes a warp of the first member 54 which is relatively thin, the lower surface of the first member 54 after brazing may be flattened by polishing, for example, thereby preventing a reduction in the cooling performance.

Figure 7A:
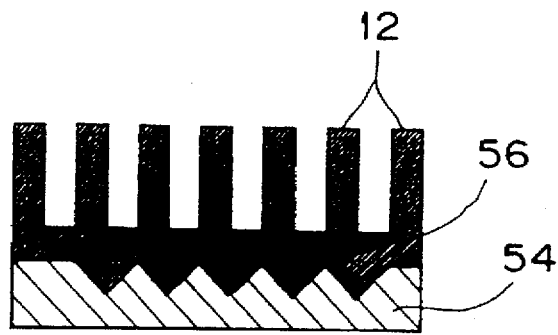
FIGS. 7A, 7B and 7C are sectional views of heat sinks showing a fifth preferred embodiment of the present invention.
Figure 7B:
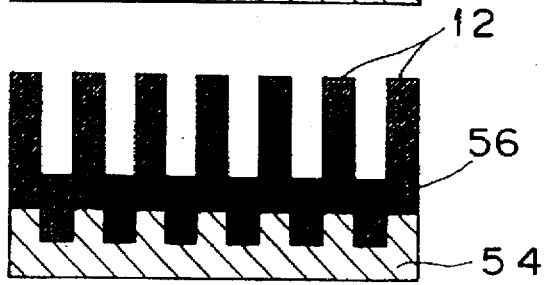
Figure 7C:
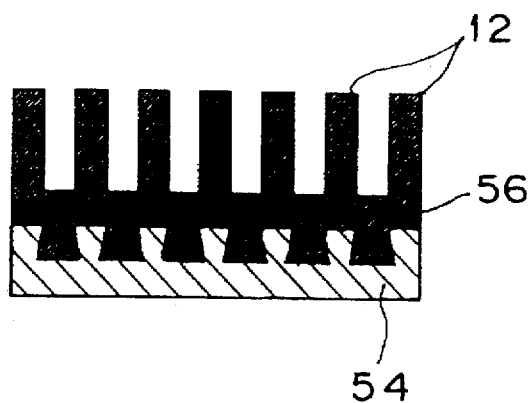

In order to increase the bonding area between the first member 54 and the second member 56, the bonding surfaces of the first and second members 54 and 56 may be formed with irregularities meshing with each other. Examples of such irregularities are shown in FIGS. 7A, 7B, and 7C as a fifth preferred embodiment of the present invention. As shown in FIGS. 7A, 7B, and 7C, the sectional shapes of the irregularities on the bonding surfaces are triangular, rectangular, and trapezoidal, respectively. The formation of such irregularities allows improvement in thermal conductivity between the first member 54 and the second member 56, thereby improving the cooling performance of the heat sink.

Figure 8:
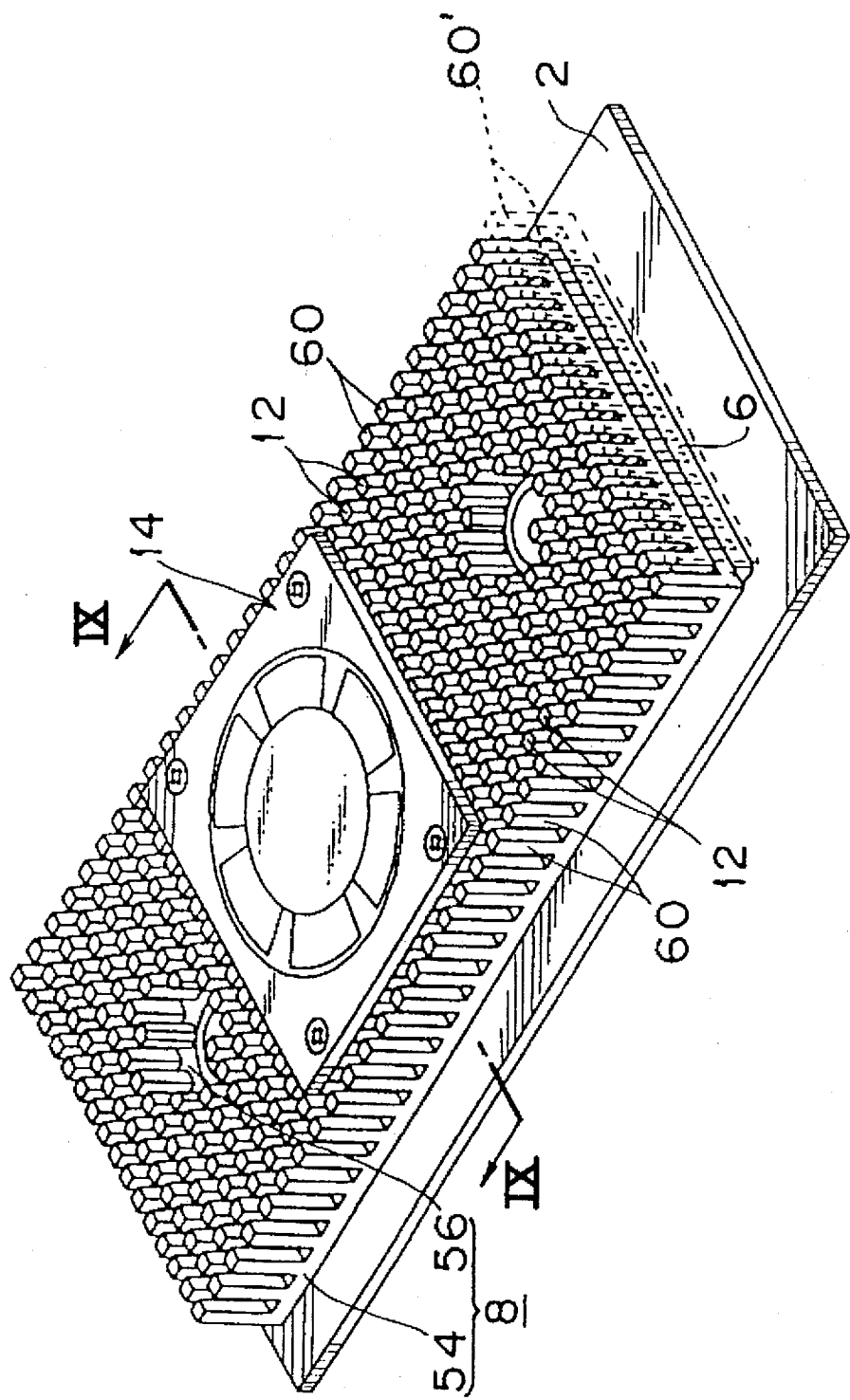
FIG. 8 is a perspective view of a heat sink showing a sixth preferred embodiment of the present invention.
Figure 9:
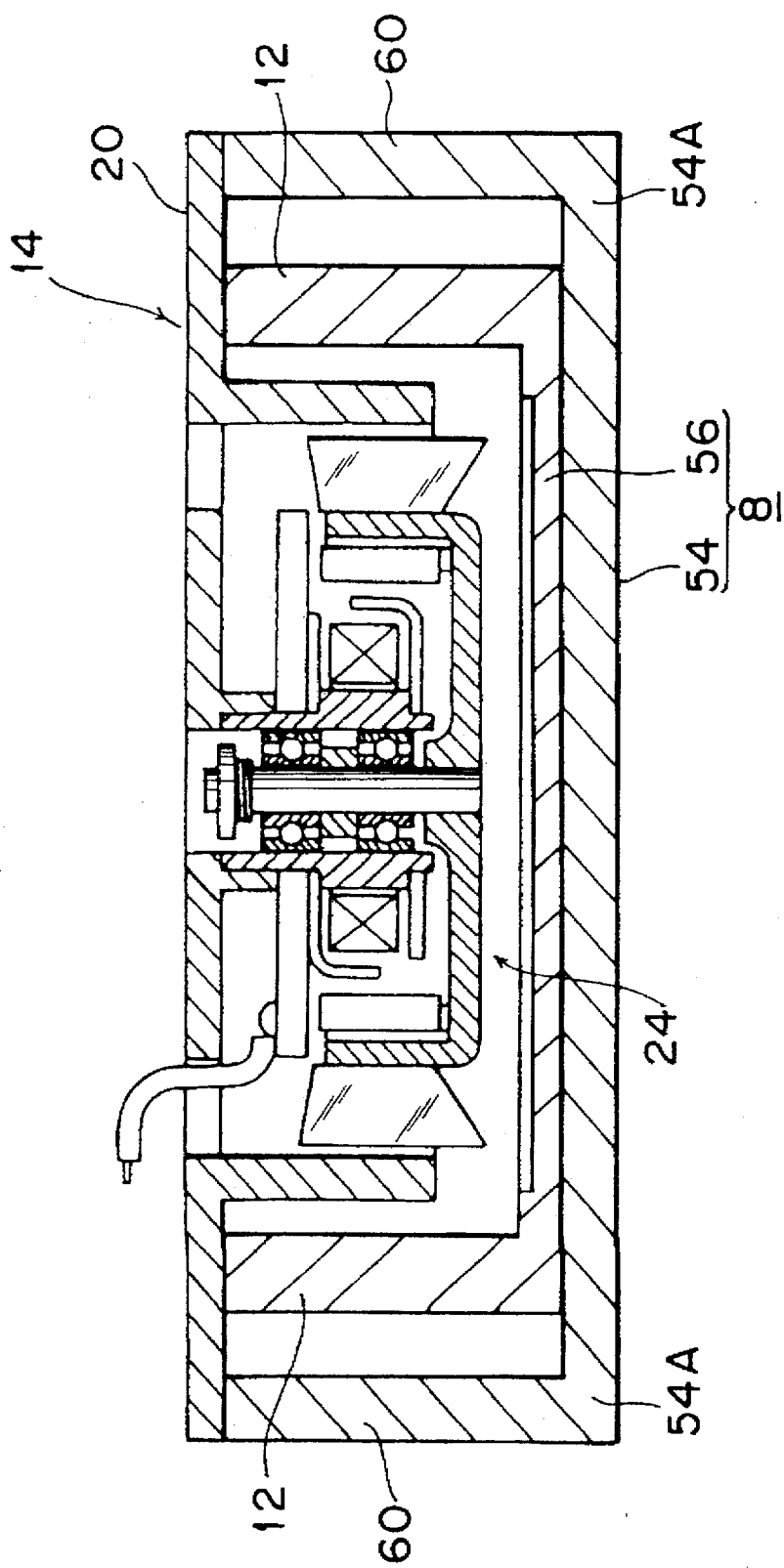
FIG. 9 is a cross section taken along the line IX—IX in FIG. 8.

FIG. 8 is a perspective view of a heat sink showing a sixth preferred embodiment of the present invention, and FIG. 9 is a cross section taken along the line IX—IX in FIG. 8. In contrast with the third preferred embodiment shown in FIG. 5, the sixth preferred embodiment is characterized in that the first member 54 has two edge portions 54A projecting outside of the second member 56 and a plurality of auxiliary fins 60 integral with the edge portions 54A. The fins 12 integral with the second member 56 are regularly arranged at the same pitch in both the longitudinal direction and the lateral direction of the second member 56. The auxiliary fins 60 are also regularly arranged at the same pitch as that of the fins 12. Although the auxiliary fins 60 are formed at both side portions of the base member 8 in its lateral direction only, additional auxiliary fins as shown by broken lines 60' may be further formed at both end portions of the base member 8 in its longitudinal direction. According to this preferred embodiment, the cooling effect of the first member 54 can be improved to thereby improve the cooling performance of the heat sink.

Figure 10:
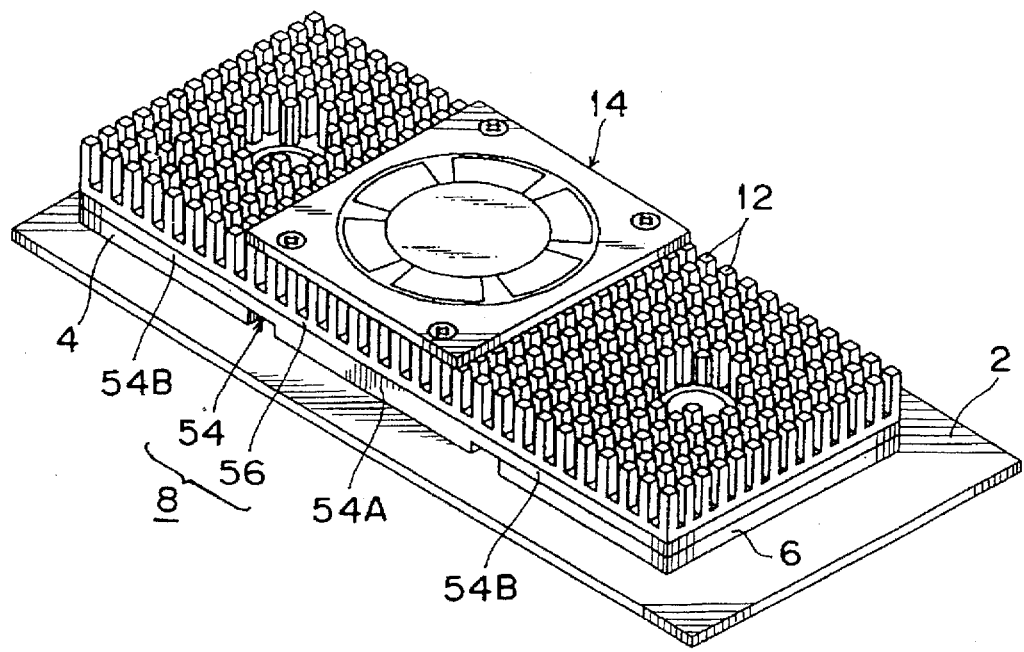
FIG. 10 is a perspective view of a heat sink showing a seventh preferred embodiment of the present invention.

FIG. 10 is a perspective view of a heat sink showing a seventh preferred embodiment of the present invention. This preferred embodiment is characterized in that a portion 54A of the first member 54 located between the integrated circuit packages 4 and 6 is larger in thickness than a portion 54B of the first member 54 making close contact with the integrated circuit packages 4 and 6. According to this preferred embodiment, the thermal conductivity of the first member 54 can be improved to thereby improve the cooling performance of the heat sink. Further, an upper surface of the thicker portion 54A of the first member 54 may be formed with a recess for partially storing the motor of the fan assembly 14, thereby allowing a thin structure of the heat sink.

Figure 11:
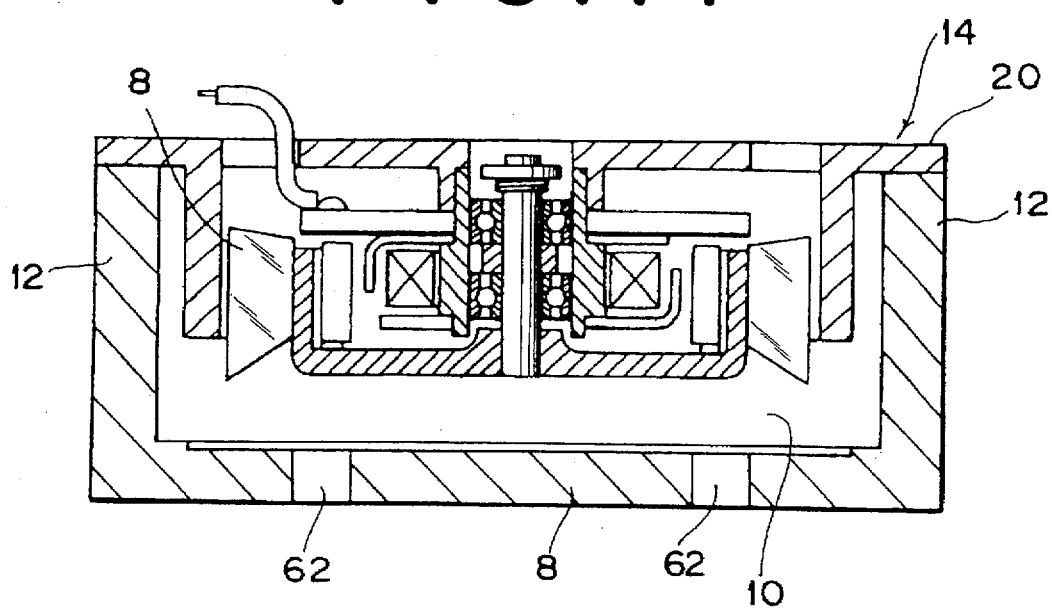
FIG. 11 is a cross section of a heat sink showing an eighth preferred embodiment of the present invention.

FIG. 11 is a cross section of a heat sink showing an eighth preferred embodiment of the present invention. The position of the cross section shown in FIG. 11 is the same as that of the cross section shown in FIG. 3. This preferred embodiment is characterized in that the base member 8 has a plurality of air circulation holes 62 extending from the upper surface to the lower surface of the base member 8. The holes 62 are formed in the blowing region 10 between the integrated circuit packages 4 and 6. In particular, the holes 62 are arranged along the locus of rotation of the blades 26 of the fan assembly 14 in this preferred embodiment. The presence of the holes 62 allows pass of high-speed air flow, thereby improving the cooling performance of the heat sink.

Figure 12:
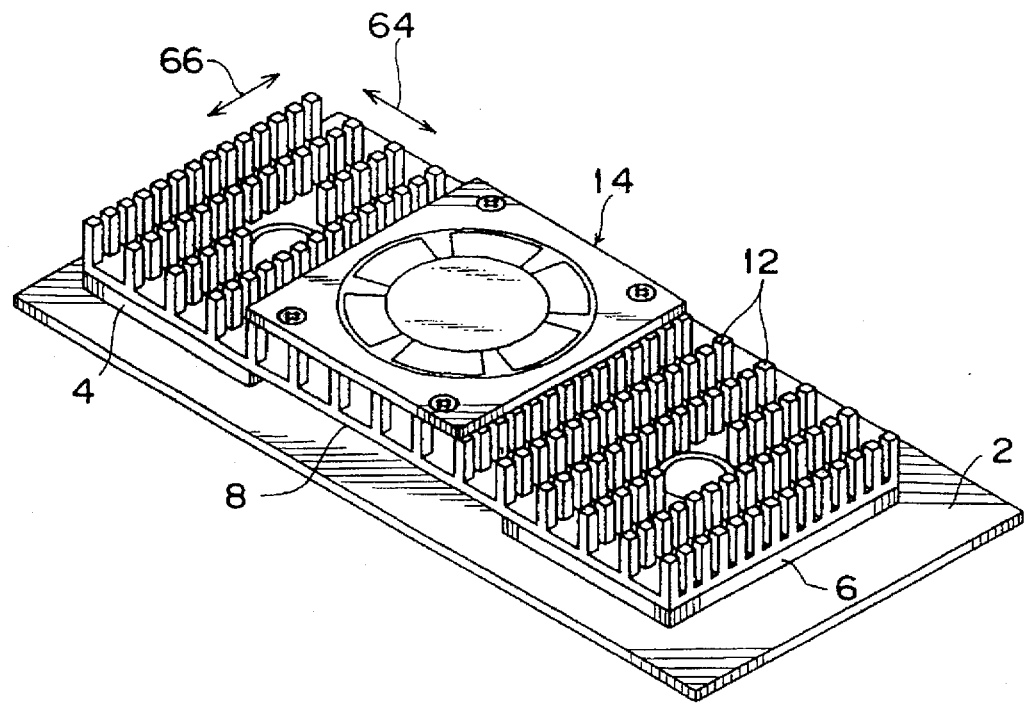
FIG. 12 is a perspective view of a heat sink showing a ninth preferred embodiment of the present invention.

FIG. 12 is a perspective view of a heat sink showing a ninth preferred embodiment of the present invention. The fins 12 are regularly arranged in the longitudinal direction (shown by an arrow 64) and the lateral direction (shown by an arrow 66) on the upper surface of the base member 8. In particular, the pitch of the fins 12 in the longitudinal direction is set larger than that of the fins 12 in the lateral direction. Such an arrangement of the fins 12 provides an advantage such that when the heat sink is used in the environment of generating an air flow, this air flow can be effectively utilized in cooling the heating elements. For example, in the case that the heat sink is applied to a device in which an air flow is generated by a system fan or the like, the lateral direction (arrow 66) where the pitch of the fins 12 is smaller is made substantially accord with the direction of the air flow in the device. Accordingly, the air flow in the device usually weaker than the air flow generated by the fan assembly 14 is passed in the direction of the arrow 66, and the air flow generated by the fan assembly 14 is passed mainly in the direction of the arrow 64, thus effectively utilizing the air flow in the device. As a result, the cooling performance of the heat sink can be improved.

Figure 13:
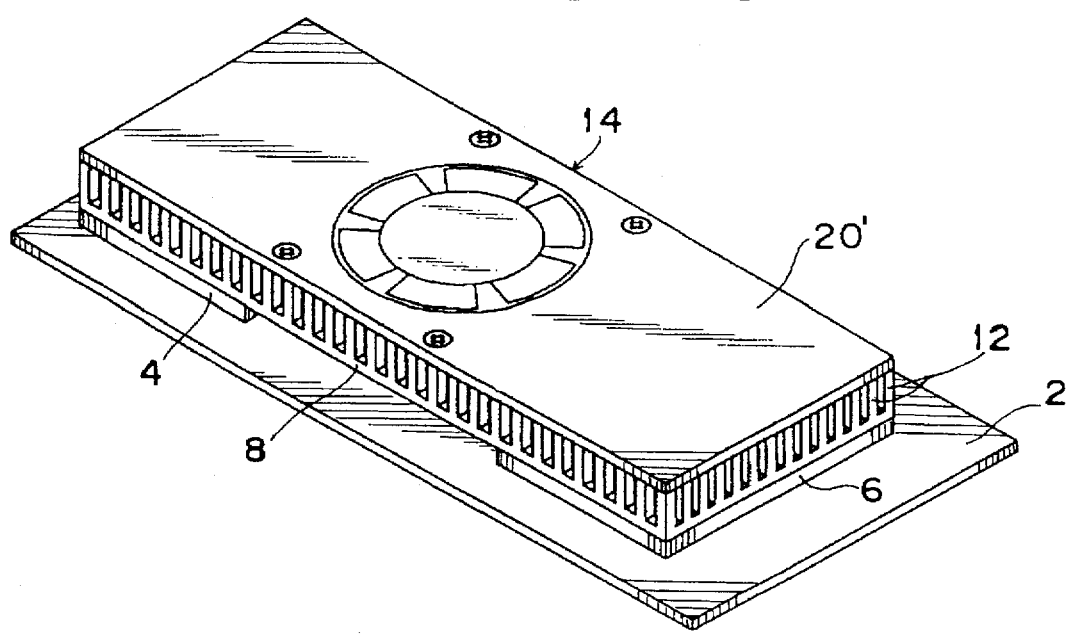
FIG. 13 is a perspective view of a heat sink showing a tenth preferred embodiment of the present invention.

FIG. 13 is a perspective view of a heat sink showing a tenth preferred embodiment of the present invention. This preferred embodiment is characterized in that the fan assembly 14 has a cover 20' large enough to cover almost all of the fins 12. According to this preferred embodiment, the velocity of air flowing through the fins 12 by the fan assembly 14 can be increased to thereby improve the cooling performance of the heat sink.

Figure 14:
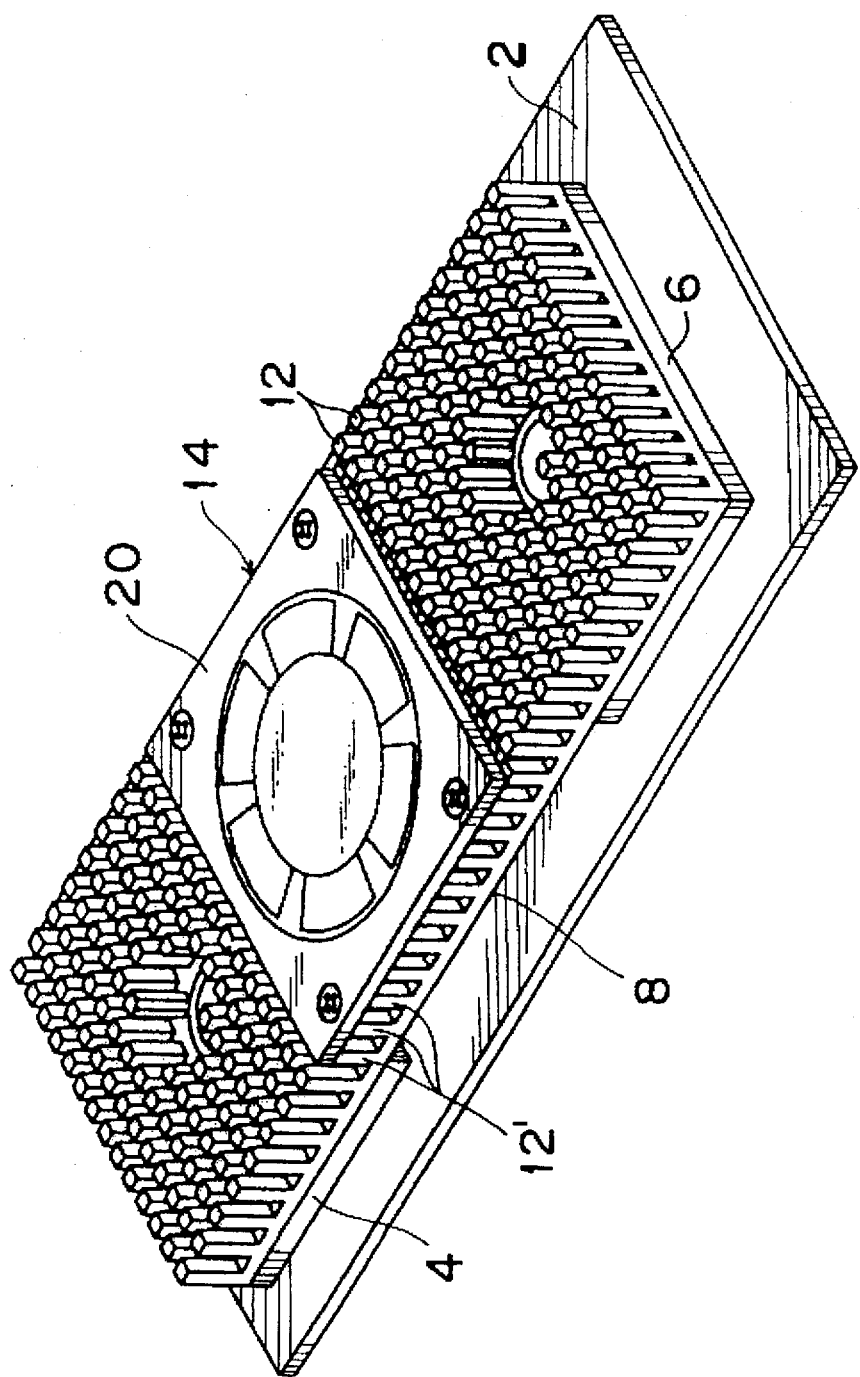
FIG. 14 is a perspective view of a heat sink showing an eleventh preferred embodiment of the present invention.

FIG. 14 is a perspective view of a heat sink showing an eleventh preferred embodiment of the present invention. As similar to the first preferred embodiment shown in FIG. 1, the cover 20 of the fan assembly 14 covers a part 12' of all the fins 12 near the blowing region. The feature of this preferred embodiment is that the fins 12' covered with the cover 20 are shorter than the other fins 12. According to this preferred embodiment, the length of each shorter fin 12' is set so that the fan assembly 14 does not project from the upper ends of the other longer fins 12. Accordingly, the heat sink can be reduced in thickness. This effect can therefore be more enhanced by suitably combining this preferred embodiment with the seventh preferred embodiment shown in FIG. 10.

Although the heating elements are the integrated circuit packages 4 and 6 only in the above preferred embodiments, the present invention may be applied also in the case where other heating elements are mounted on the printed wiring board or at any other positions. In this case, the shape of the base member is set according to the positions and the shapes of the other heating elements, and the base member is made in contact with the other heating elements.

The present invention is not limited to the details of the above described preferred embodimetns. The scope of the invention is defined by the appended claims and all changes and modifications as fall within the equivalence of the scope of theclaims are therefore to be embraced by the invention.

What is claim is:

1. A heat sink for removing heat from at least two heating elements mounted on a printed wiring board, comprising:

a base member having a lower surface and an upper surface, said lower surface being mounted on said first and second heating elements, said upper surface having a blowing region located between said first and second heating elements, and a plurality of upwardly projecting radiation fins formed on the upper surface except at said blowing region; and an air blower provided in said blowing region for circulating air through said radiation fins.

2. A heat sink according to claim 1, wherein said air blower comprises:

a cover fixed to said radiation fins so as to cover said blowing region;

a motor fixed to said cover and having a spindle extending in a direction of thickness of said base member;

a blade adapted to be rotated by said motor; and a driving circuit for driving said motor.

3. A heat sink according to claim 2, wherein said cover covers substantially all of the radiation fins.

4. A heat sink according to claim 1, wherein said base member has a multilayer structure including a first member mounted on said first and second heating elements and a second member from which the radiation fins project, the second member being integrally formed with said radiation fins.

5. A heat sink according to claim 4, wherein said first member has a thermal conductivity larger than that of said second member.

6. A heat sink according to claim 5, wherein said first member is formed of a material selected from copper and copper tungsten, and said second member is formed of aluminum.

7. A heat sink according to claim 6, wherein said second member has a nickel plating layer formed on at least a lower surface thereof, and said first member and said second member are bonded together by soldering.

8. A heat sink according to claim 4, wherein said first member and said second member respectively have opposing surfaces bonded together, the opposing surfaces having irregularities meshing with each other to increase a bonding area.

9. A heat sink according to claim 4, wherein said first member has an edge portion projecting outside of said second member and auxiliary fins integral with said edge portion.

10. A heat sink according to claim 1, wherein said base member has an air circulation hole extending from said upper surface to said lower surface in said blowing region for providing external air communication to the air blower.

11. A heat sink according to claim 4, wherein a portion of said first member located between said first and second heating elements is thicker than a remainder, portion of said first member located adjacent to one of said first and second heating elements.

12. A heat sink according to claim 1, wherein said radiation fins are regularly spaced at a first pitch in a longitudinal direction of said base member and regularly spaced at a second pitch in a lateral direction of said base member, and the first pitch of said radiation fins is different from the second pitch of said radiation fins.

13. A heat sink according to claim 12, wherein said heat sink is part of a device in which an air flow is generated by an external device to flow in one of said longitudinal direction and said lateral direction, and the pitch of said radiation fins is smaller in the direction of said air flow generated by said external device.

14. A heat sink according to claim 2, wherein said cover covers a first portion of said radiation fins and does not cover a second portion of said radiation fins, said first portion being located in the vicinity of said blowing region, and said first portion encompassing fewer radiation fins than said second portion.

15. A heat sink according to claim 1, wherein the first and second heating elements are semiconductor chips.

16. A heat sink according to claim 1, wherein the first and second heating elements are semiconductor chips enclosed respectively in first and second integrated circuit packages.

17. A heat generating and cooling device, comprising:

two heating elements mounted on a printed circuit board with a spacing area therebetween;

a base member having opposing lower and upper surfaces, the lower surface being secured to the two heating elements and having a spacing area facing the spacing area between the heating elements, the upper surface having a blowing region located to oppose at least a portion of the spacing area of the lower surface, the upper surface having upwardly projecting heat radiation fins formed thereon except at the blowing region; and an air blower positioned in the blowing region for moving air through the heat radiation fins.

* * * * *

UNITED STATES PATENT AND TRADEMARK OFFICE
CERTIFICATE OF CORRECTION

PATENT NO. : 5,689,404
DATED : November 18, 1997
INVENTOR(S) : Tadashi KATSUI, et al.

It is certified that error appears in the above-indentified patent and that said Letters Patent is hereby corrected as shown below:

TITLE PAGE [54] TITLE OF INVENTION

"TINS" should be --FINS--.

<u>Column 1</u>

Line 1, "TINS" should be --FINS--.

Signed and Sealed this

Twenty-fourth Day of February, 1998

*Attest:*

BRUCE LEHMAN

*Attesting Officer*      *Commissioner of Patents and Trademarks*